HIGH-SPEED FREQUENCY DIVIDER

Filed March 24, 1966

INVENTOR.
JOHN J. ANDREA
BY
Moody and Phillion
ATTORNEYS

United States Patent Office 3,392,291
Patented July 9, 1968

3,392,291

HIGH-SPEED FREQUENCY DIVIDER

John J. Andrea, Marion, Iowa, assignor to Collins Radio Company, Cedar Rapids, Iowa, a corporation of Iowa Filed Mar. 24, 1966, Ser. No. 537,218
5 Claims. (Cl. 307—291)

ABSTRACT OF THE DISCLOSURE

A high-speed frequency divider employing a conventional flip-flop with first and second transistors and crossover networks between collector and base electrodes. A second auxiliary pair of oppositely poled transistors connect oppositely phased terminals of signal input means to the bases of the first and second transistors, respectively. The collector of the first transistor is connected through resistive means to the bases of the auxiliary transistors. Thus, when the first transistor is nonconductive, both auxiliary transistors are primed for conductivity at the next proper half cycle of the input signal. One of said auxilliary transistors causes the first transistor to quickly become conductive and the other auxilliary transistor will cause the conductive transistor to become nonconductive since it supplies an oppositely poled input signal to the base of said conductive transistor. A second pair of auxilliary transistors is similarly connected to shift the flip-flop during the other half cycle of the input signal.

This invention relates generally to frequency dividers employing flip-flop circuits and, more specifically, to a frequency divider employing flip-flop circuits but capable of a higher speed of operation than obtainable heretofore.

Flip-flop circuits have long been used as the basic elements of frequency dividers. One of the more common type flip-flop circuits used has been the Eccles-Jordan circuit which usually consists of a pair of electron valves, such as vacuum tubes or transistors, with crossover circuits extending from the collector electrodes of each of the two transistors to the base electrode of the other transistor, in the case where transistors are employed. Such crossover networks usually are comprised of a resistive impedance with a capacitive impedance frequently provided in series therewith. Also involved in the operation of the circuit are the electrode capacitances of the two transistors. More specifically, the switching time of the flip-flop circuit is related directly to the RC time constant of the crossover networks, which crossover network includes the interelectrode capacitances of the transistors. In some circuits the speed is increased by eliminating the component capacitance in the crossover networks. However, it is virtually impossible to remove all of the base-to-emitter electrode capacitances of the transistors, which capacitances introduce a limiting effect on the switching speed at the flip-flop circuits.

A primary object of the present invention is to provide a frequency divider employing a flip-flop circuit as a basic dividing means, but having a higher speed of operation than is normally attainable with flip-flop circuits.

A second purpose of the invention is a frequency divider using a flip-flop circuit with a means for overcoming the limitation of speed of operation caused by the RC time constant involving the interelectrode capacitances of the transistors.

A third aim of the invention is a high-speed frequency divider employing flip-flop circuits.

A fourth aim of the invention is the improvement of frequency dividers, generally.

In accordance with the invention, there is provided a flip-flop circuit comprised of first and second electron valves (such as transistors), each with an electron emitting electrode, an electron collector electrode, and an electron control electrode, and electrical crossover means connecting the electron collector electrode of each valve to the control electrode of the other valve. A second, oppositely poled third and fourth electron valves (such as transistors) connect oppositely phased terminals of the signal input means to the control electrodes of said first and second electron valves, respectively. Means are provided to connect the collector electrode of said first electron valves to the base electrodes of said third and fourth transistors. A third auxiliary pair of oppositely poled fifth and sixth electron valves (such as transistors) also connect oppositely phased terminals of said signal input means to the control electrodes of said second and first electrode valves, respectively. Means are provided to connect the collector electrode of the second electrode valve to the bases of the fifth and sixth transistors.

In operation either the first or the second, but not both, of the first and second transistors will be conductive and the other will be nonconductive. The nonconductive transistor will have a relatively high collector potential which primes the base electrode of the associated pair of transistors into the conductive range. The conductive transistor has a lower collector potential so that the bases of the associated pair of transistors are biased below cutoff. The input signals are supplied directly to the second and third pairs of transistors. Furthermore, the input signal is comprised of a positive and negative signal (a two-terminal input signal means with the signal on the two terminals being 180° out of phase with each other), which positive and negative input signals are simultaneously connected across the two inputs of each of the second and third pairs of resistors. However, only that pair of transistors whose base electrode has been previously primed into the operating range will pass the supplied positive and negative input signals. Such pair of transistors pass the negative and positive input signals to the proper first and second control electrodes, so that the conductive transistor is made nonconductive and the nonconductive transistor is made conductive. Upon reception of the next input pulse, the other pair of auxiliary transistors operates in its conductive range and functions to reverse the states of the first and second transistors in a similar manner.

In accordance with an important feature of the invention, the second and third pairs of auxiliary transistors function to shift the states of the transistors of the flip-flop circuit at a much faster speed than would be otherwise obtainable and, further, to shift said states simultaneously. More specifically, in the absence of the auxiliary transistors the interelectrode capacitances of the flip-flop circuit transistors would limit speed of operation, since a finite time is required to charge the interelectrode capacitances through the crossover networks to perform a switching function. The two pairs of auxiliary transistors effectively bypass the crossover networks and thereby function to charge such interelectrode capacitances in a much faster manner, largely because the resistances of the primed auxiliary transistors are considerably less than the resistances in the bypassed crossover networks, thus reducing the RC time constant, and further because the switching of the flip-flop transistors occurs simultaneously rather than in series, where one transistor of the flip-flop switches the other.

The above-mentioned and other objects of the invention will be more fully understood from the following detailed description thereof when read in conjunction with the drawings in which.

Figure 1:
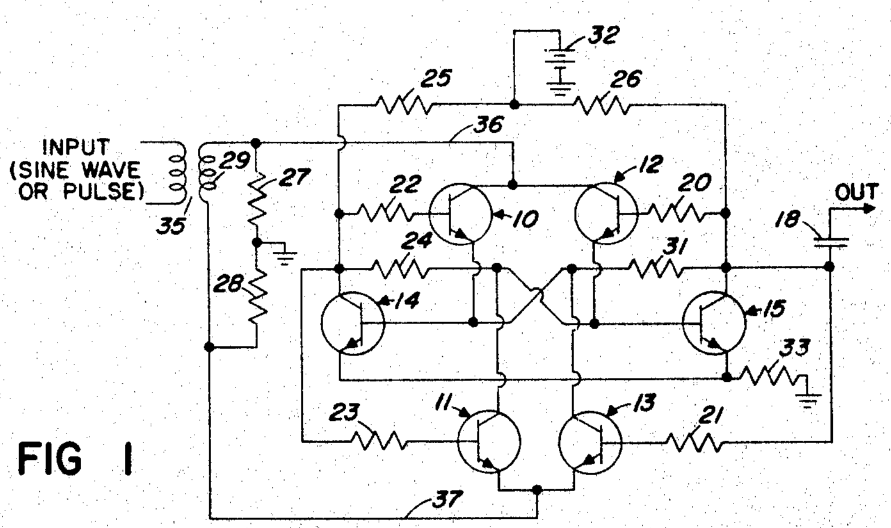
FIG. 1 is a schematic diagram of the invention.

Referring now to FIG. 1, the basic flip-flop circuit is comprised of transistors 14 and 15, and crossover networks comprised of resistors 24 and 31. It can be seen from FIG. 1 that resistor 24 connects the collector of transistor 14 to the base of transistor 15, and that the resistor 31 connects the collector of transistor 15 to the base of transistor 14. The collectors of the two transistors 14 and 15 are connected to positive battery source 32 through resistors 25 and 26, respectively.

Resistor 33 is common to the emitters of both transistors 14 and 15 and connects such emitters to ground potential.

The input signal, which can be a sine wave, is supplied to the primary of transformer 35. Across the secondary 29 of transformer 35 are connected resistors 27 and 28, which are of equal value, and with the common terminal thereof connected to ground. Thus, resistors 27 and 28 function to divide the signal supplied to the secondary transformer 29 into equal and oppositely poled signals.

The input signals are not supplied directly to the bases of the transistors 14 and 15, but rather are supplied to said bases through auxiliary transistors 10, 11, 12, and 13. Such transistors 10, 11, 12, and 13 are divided into and operate as, two pairs. One pair consists of transistors 10 and 11, and the other pair consists of transistors 12 and 13.

Transistors 10 and 11 are connected in such a manner that the collector electrode of transistor 10 is connected to one terminal of secondary winding 29 and the emitter electrode of transistor 11 is connected to the other terminal of secondary winding 29. Further, the emitter of transistor 10 is connected to the base of transistor 14, whereas the collector electrode of transistor 11 is connected to the base of transistor 15.

The connections of transistors 12 and 13 are much the same as that of transistors 10 and 11, except for the important difference that the emitter of transistor 12 is connnected to the base of transistor 15 and the collector of transistor 13 is connected to the base of transistor 14, which connections are opposite to that of transistors 10 and 11, as can be seen from FIG. 1.

Resistors 22 and 23, respectively, connect the bases of transistors 10 and 11 to the collector electrode of transistor 14. In a similar manner resistors 20 and 21 connect the bases of transistors 12 and 13 to the collector of transistor 15. The circuit parameters are selected so that when one of the two transistors 14 or 15 is conductive, the associated pair of auxiliary transistors 10 and 11, or 12 and 13, will be biased into the nonconductive range. More specifically, assume that transistor 14 is in a conductive state and that transistor 15 is in a nonconductive state. Under such conditions the potential of the collector of transistor 14 is in its low condition so that the bases of transistors 10 and 11 are below cutoff value, thus presenting a high impedance to any pulse supplied from the input source via leads 36 and 37. On the other hand, the transistor 15 is in a nonconductive state so that the potential of its collector electrode is in its high condition, thus biasing the bases of transistors 12 and 13 into the conductive range of said transistors 12 and 13. Consequently, when the input signal induced in secondary winding 29 is such that a positive voltage apppears on lead 36 and a negative voltage appears on input lead 37, both the transistor 12 and the transistor 13 will be conductive; i.e., will present a low impedance to such input signals. Consequently, the base of transistor 15, which is connected to the emitter of transistor 12, will be driven in a positive direction into the conductive range of transistor 15, whereas the base of transistor 14, which is connected to the collector of transistor 13, will be driven in a negative direction towards the nonconductive range. Since the impedance of transistors 12 and 13 is very low at this time, the RC time constants involved in switching transistors 14 and 15 are very low and switching occurs very rapidly.

It is to be specifically noted that as the process of switching occurs, a point is reached where the crossover networks, comprising resistors 24 and 31, become dominant and cause a rapid completion of the switching process.

During the time that the switching process described above has been occurring, the transistors 10 and 11 have been, for all practical purposes, inactive due to the fact that their bases were biased into the nonconductive range by the collector potential of the transistor 14. However, after the switching process has occurred, the collector potential of nonconductive transistor 14 will be high and the collector potential of the now conductive transistor 15 will be low. Thus, transistors 10 and 11 will now be biased into the conductive range in preparation for the reception of the next input signal. On the other hand, the transistors 12 and 13 will have their bases biased into the nonconductive range by the low potential state of the collector of transistor 15.

Thus when the input signal again produces a positive pulse on input lead 36 and negative pulse on lead 37, the transistors 10 and 11 will function to drive the base of transistor 14 positive and the base of transistor 15 negative, thus causing transistor 14 to become conductive once again and transistor 15 to become nonconductive once again.

The switching of the circuit occurs only on alternate half cycles of the input sine wave applied to the primary of transformer 35. More specifically, switching occurs only on those alternate half cycles when the input lead 36 is positive and the input lead 37 is negative. On the other half cycles, when input lead 36 is negative and input lead 37 is positive, none of the transistors 10 through 13 can pass the signal since they will all, under such conditions, present high impedances to the applied input signal.

It should be noted specifically that the RC time constant of the crossover networks, comprised of resistors 24 and 31, when used as switching circuits would be appreciably larger than where transistors 10 through 13 are employed as the switching means. Such increased RC time constants are due, as discussed above, to the fact that resistances 24 and 31 are considerably larger than the resistive impedances presented by transistors 10 through 13 when they are conductive. The capacitances involved, in either mode of switching, are primarily the interelectrode capacitances of transistors 14 and 15, which cannot be substantially altered. However, if the resistive portion of the RC time constant is very small, then the RC time constant also becomes quite small.

In the actual operation of the circuit, as the bases of the two transistors 14 and 15 are being pulled up and down (assume the base of transistor 14 is being pulled up and the base of transistor 15 is being pulled down), they will reach a point of approximate firing potential, and a snap action will occur. Such snap action is due to amplification in the flip-flop circuit itself, and occurs in the crossover networks comprised of resistors 24 and 31. For example, as the collector potential of transistor 15 goes negative, the collector potential of transistor 14 goes positive. These two collector potentials each aid the other transistor in turning off and on, respectively. The two conductive transistor 12 and 13, which have acted as gates in passing the input signal to the bases, will now become subordinate to the snap action of the two flip-flop circuits. In other words, the signal supplied through the crossover networks now becomes dominant and controls the switching action to the completion thereof.

During the switching action, when transistor 14 is becoming nonconductive and the collector thereof is becoming more positive, a certain time is required for the auxiliary transistors 10 and 11 to become turned on, because of the time constant caused by resistors 22 and 23 and the base-to-emitter electrode capacitances of transistors 10 and 11. Such delay, however, is needed in order to permit the input pulse to subside before transistors 10 and 11 become fully conductive. Furthermore, the time delay involved in causing transistors 10 and 11 to become conductive does not materially affect the speed of operation of the circuit since such time delay overlaps the time interval during which the transistor 14 is becoming non-conductive. In other words, the delay time involved in turning on transistors 10 and 11, or transistors 12 and 13, is made to be just slightly greater than the duration of the input pulse, so that a single input pulse will cause no more than one switching of the flip-flop circuit. The values of resistors 20, 21, 22, and 23 can be made quite small in order to decrease the time required to turn on the transistors 10 through 13.

An important consideration relating to the turning on of either pair of transistors 10 and 11, or 12 and 13, is the dominating effect of the cross-over circuits which, as discussed above, occurs at some point during the switching process. Once the crossover effect becomes dominant, the effect of the signal supplied through any of the transistors 10 through 13 is relatively unimportant, so that the switching of auxiliary transistors 10 and 11, for example, can be made to occur during such time. It can be seen that there will be no undesirable effects produced by the turning on of transistors 10 and 11 during crossover switching; assuming, of course, that the input signal has terminated at this time. If the input signal should continue beyond the switching of transistors 14 and 15, and also the turning on of transistors 10 and 11, then a second, undesirable, switching will occur. However, by proper design the input signal can be made to terminate so that no second switching will occur.

From the above, it will be apparent that the specific time of turning on of auxiliary transistors 10 and 11, or 12 and 13, is not critical as long as it occurs after the takeover of the switching action by the crossover networks.

It has been found that the circuit of the present invention has a considerable degree of reliability. With an input signal of constant amplitude, it has been found that the circuit will operate from −80° C. to 130° C. without any appreciable deterioration of circuit performance. Frequency-wise, the circuit has operated from 30 to 250 megacycles.

Figure 2:
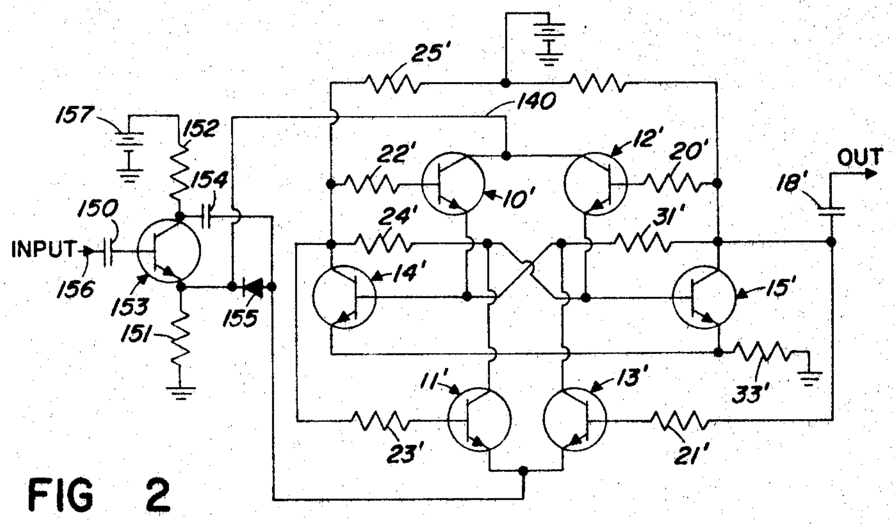
FIG. 2 is a schematic diagram of the invention employing a different type input means.

Referring now to FIG. 2, there is shown the second form of the invention in which the only difference is in the driving or input circuit. Whereas the circuit of FIG. 1 employs a transformer input, the circuit of FIG. 2 employs a phase splitter type input. Such phase splitter is comprised of transistor 153 with the collector electrode thereof being connected to positive battery source 157 through resistor 152, and the emitter being connected to ground through resistor 151. The input signal is supplied via lead 156 and capacitor 150 to the base of transistor 153. Since transistor 153 turns on slightly faster than it turns off, the emitter circuit is coupled to the collectors of transistors 10′ and 12′ through lead 140 for the pull-up voltage; i.e., the voltage employed to pull up the base potentials of transistors 14′ and 15′. The signal on the collector of transistor 153 is coupled through capacitor 154 to the emitters of gating transistors 11′ and 13′, which provides the negative pulse on the emitter circuit of transistors 11′ and 13′.

Diode 155 is provided to perform the following function. When the input supplied to driving transistor 153 is terminated, it is desirable to restore the voltage on the right-hand plate of capacitor 154 to zero. Otherwise, such capacitor plate would eventually charge up and the circuit would become blocked. The high-speed diode 155 provides a discharge circuit for the right-hand plate of capacitor 154.

Since the phase splitter input circuit of FIG. 2 does not provide a precise 180° phase shift at the collector and emitter electrodes thereof, the transformer input of FIG. 1 is probably somewhat preferable to the phase splitter of FIG. 2.

It is to be understood that the forms of the invention shown and described herein are but preferred embodiments thereof and that various changes may be made in the circuit arrangement without departing from the spirit or scope thereof. For example, it would be quite within the ordinary skills of an engineer working in the frequency divider art to employ PNP type transistors in the circuit rather than NPN type transistors, as shown in the figures.

I claim:

1. Frequency divider means comprising:

flip-flop circuit means comprising:

first and second electron valve means forming a first pair of electron valves, each having an electron emitting means, an electron collecting means, and an electron control means;

cross-over circuits connecting the electron collecting means of each of said first and second electron valves to the electron control means of the other of said electron valves;

and means for supplying a direct current voltage source across said electron collecting means and said electron emitting means of said first and second electron valve means;

a two-terminal input signal source with opposite polarities of the input signal appearing on said two terminals;

third and fourth electron valves forming a second pair of electron valves;

fifth and sixth electron valves forming a third pair of electron valves;

each of said third, fourth, fifth, and sixth electron valves having an electron emitting means, an electron collecting means, and an electron control means;

means for connecting the electron collecting means of said third and fifth electron valves to a first terminal of said input signal source and the electron emitter means to the electron control means of said first and second electron valves, respectively;

means for connecting the electron emitting means of said fourth and sixth electron valves to the second terminal of said input signal source and the electron collector means to the electron control means of said second and first electron valves, respectively;

means for connecting the electron control means of said third and fourth electron valves to the electron collecting means of said first electron valve;

and means for connecting the electron control means of said fifth and sixth electron valves to the electron collecting means of said second electron valve.

2. Frequency divider means comprising:

flip-flop circuit means comprising:

first and second electron valve means forming a first pair of electron valves each having an electron emitting means, an electron collecting means, and an electron control means;

cross-over circuits connecting the electron collecting means of each of said first and second electron valves to the electron control means of the other of said electron valves;

and means for supplying a direct current voltage across said electron collecting means and said electron emitting means of said first and second electron valve means;

a two-terminal input signal source with opposite polarities of the input signal appearing on said two terminals;

a first pair of first and second variable asymmetrical impedances each having first and second terminals and a control terminal and with the first terminal of each of said first pair of variable impedances connected to a first terminal of said input signal source and with second terminals thereof individually connected to separate ones of the electron control means of said first and second electron valves, respectively;

a second pair of third and fourth variable asymmetrical impedances each having first and second terminals and a control terminal and with the first terminal of each of said second pair of said variable impedances connected to the second terminal of said input signal source and the second terminals thereof being connected to separate ones of the electron control means of said second and first electron valves, respectively;

the forward impedance of said first pair of variable impedances being presented to said first terminal of said input signal source and the reverse impedance of said second pair of variable impedances being presented to said second terminal of said input signal source;

means for connecting the control terminals of said first and third variable impedances to the electron collecting means of said first electron valve to cause the impedances of said first and third variable impedances to become small when said first electron valve is nonconductive;

and means for connecting the control terminals of said second and fourth variable impedances to the electron collecting means of said second electron valve to cause the impedances of said second and fourth variable impedances to become small when said second electron valve is nonconductive.

3. Frequency divider means comprising:

flip-flop circuit means comprising:

first and second electron valve means forming a first pair of electron valves each having an electron emitting means, an electron collecting means, and an electron control means;

cross-over circuits connecting the electron collecting means of each of said first and second electron valves to the electron control means of the other of said electron valves;

and means for supplying a biasing voltage across said electron collecting means and said electron emitting means of said first and second electron valve means;

a two-terminal input signal source with opposite polarities of the input signal appearing on said two terminals;

a first pair of variable impedance means responsive to the nonconductive state of said first electron valve to provide low impedance paths from the first terminal of said input signal source to the electron control means of said first electron valve, and from the second terminal of said input signal source to the electron control means of said second electron valve;

and a second pair of variable impedance means responsive to the nonconductive state of said second electron valve to provide low impedance paths from the first terminal of said input signal source to the electron control means of said second electron valve and from the second terminal of said input signal source to the electron control means of said first electron valve.

4. Frequency divider means in accordance with claim 3 in which:

said first and second pairs of variable impedances comprise third and fourth electron valves and fifth and sixth electron valves, respectively;

each of said electron valves comprising an electron emitting means an electron collecting means and an electron control means;

means for connecting the said electron collecting means of said third and fifth electron valves to said first terminal of said input means and the electron emitter means of said third and fifth electron valves to the electron control means of said first and second electron valves, respectively;

means for connecting the said electron emitting means of said fourth and sixth electron valves to the second input terminal of said input signal source and the electron collecting means of said fourth and sixth electron valves to the electron control means of said second and first electron valves, respectively.

5. Frequency divider means in accordance with claim 4 comprising:

means for connecting the electron control means of said third and fourth electron valves to the electron collecting means of said first electron valve to produce a low impedance in said third and fourth electron valves when said first electron valve is nonconductive;

and means for connecting the electron control means of said fifth and sixth electron valves to the electron collecting means of said second electron valve to produce a low impedance in said fifth and sixth electron valves when said second electron valve is nonconductive.

References Cited

UNITED STATES PATENTS

| | | | |
|---|---|---|---|
| 3,132,265 | 5/1964 | Welken et al. | 307—88.5 |
| 3,182,210 | 5/1965 | Jebens | 307—88.5 |
| 3,246,175 | 4/1966 | Baldwin | 307—88.5 |

JOHN S. HEYMAN, *Primary Examiner.*

UNITED STATES PATENT OFFICE

CERTIFICATE OF CORRECTION

Patent No. 3,392,291 July 9, 1968

John J. Andrea

It is certified that error appears in the above identified patent and that said Letters Patent are hereby corrected as shown below:

Column 2, line 4, after "A second," insert -- auxiliary pair of --.

Signed and sealed this 9th day of December 1969.

(SEAL)
Attest:

Edward M. Fletcher, Jr.
Attesting Officer

WILLIAM E. SCHUYLER, JR.
Commissioner of Patents